United States Patent [19]

Colquhoun et al.

[11] Patent Number: 4,541,000
[45] Date of Patent: Sep. 10, 1985

[54] VARACTOR OR MIXER DIODE WITH SURROUNDING SUBSTRATE METAL CONTACT AND TOP SURFACE ISOLATION

[75] Inventors: Alexander Colquhoun, Heilbronn-Sontheim; Erhard Kohn, Leingarten, both of Fed. Rep. of Germany

[73] Assignee: TELEFUNKEN electronic GmbH, Heilbronn, Fed. Rep. of Germany

[21] Appl. No.: 233,185

[22] Filed: Feb. 10, 1981

[30] Foreign Application Priority Data

Feb. 13, 1980 [DE] Fed. Rep. of Germany ....... 3005302

[51] Int. Cl.³ .......................................... H01L 29/48
[52] U.S. Cl. ..................................... 357/15; 357/14; 357/52; 357/56; 357/71; 357/73
[58] Field of Search ................... 357/14, 15, 56, 71, 357/73, 52

[56] References Cited

U.S. PATENT DOCUMENTS

| 3,280,382 | 10/1966 | Bendig | 357/73 |
|---|---|---|---|
| 3,476,984 | 11/1969 | Tibol | 357/15 |
| 3,541,403 | 11/1970 | Lepselter et al. | 357/56 |
| 3,657,615 | 4/1972 | Driver | 357/15 |
| 4,059,837 | 11/1977 | Suzuki et al. | 357/71 |
| 4,127,860 | 11/1978 | Beelitz et al. | 357/56 |
| 4,212,022 | 7/1980 | Beneking | 357/56 |
| 4,263,605 | 4/1981 | Christou et al. | 357/71 |
| 4,310,302 | 1/1982 | Roche et al. | 357/15 |
| 4,321,617 | 3/1982 | Duda et al. | 357/71 |
| 4,400,710 | 8/1983 | Nishizawa et al. | 357/15 |

FOREIGN PATENT DOCUMENTS

| 1514070 | 5/1972 | Fed. Rep. of Germany. |
| 2264126 | 7/1973 | Fed. Rep. of Germany. |
| 2437197 | 2/1975 | Fed. Rep. of Germany ...... 357/65 |
| 2436449 | 4/1977 | Fed. Rep. of Germany. |
| 54-22779 | 2/1979 | Japan ................................. 357/56 |

OTHER PUBLICATIONS

J. Calviello et al., "Novel GaAs Met. Diode . . . High Freq.", Electronics Letters, vol. 12, #24, Nov. 25, 1976, pp. 648-650.
V. Sokolov et al., "A 4ω, 56 db Gain . . . ImPATT Diodes", 1979, IEEE, MTT-S Int. Microwave Symp. Org., Orlando, Fla., Apr. 30-May 2, 1979, pp. 489-491.
"Measurement of Schottky Barrier Height", *Physics of Semiconductor Devices*, (1969) pp. 397 and 399.
Ingolf Ruge, *Halbleiter-Technologie*, (Springer-Verlag, Berlin-Heidelberg, New York), 1975, p. 300.
"Development of Large-Area 200-Volt Planar Voltage-Variable Capacitance Diodes", Schnable et al., IEEE, Transactions on Electron Devices, vol. ED-13, No. 12, Dec., 1966, pp. 896-900.
"Der Binär-Varaktor-Ein neues Mikrowellenbauteil", Bauelemente der Elektrotechnik, Oct., 1976, pp. 58-64, B. Siegal.

*Primary Examiner*—Joseph E. Clawson, Jr.
*Attorney, Agent, or Firm*—Spencer & Frank

[57] ABSTRACT

A varactor or mixer diode comprises a mesa shaped semiconductor element having a p-n junction barrier layer or retifying junction on its upper face and a substrate contact on its opposite face, the substrate contact extending over the side faces of the semiconductor element and ending at a small spacing from the barrier layer or junction.

15 Claims, 7 Drawing Figures

VARACTOR OR MIXER DIODE WITH SURROUNDING SUBSTRATE METAL CONTACT AND TOP SURFACE ISOLATION

CROSS REFERENCE TO RELATED APPLICATION

This application is related to commonly owned U.S. patent application Ser. No. 06/233,956 filed Feb. 12th, 1981.

BACKGROUND OF THE INVENTION

The invention relates to a varactor or mixer diode comprising a semiconductor element, which is in mesa shape and has a pn-junction, forming a rectifying layer, or a rectifying metal/semiconductor junction (Schottky contact) on the upper face of the mesa elevation, and has an ohmic substrate contact on the other side of the semiconductor element opposite the side on which the rectifying layer is to be found.

This type of semiconductor arrangement is known for example from 1976 IEEE International Solid-State Circuits Conf., pages 120/121, in which the semiconductor element is formed in mesa shape only in its region bordering the rectifying layer.

For applications for tuners, for example for VHF and UHF television tuners, high-quality variable capacitance diodes are required which have a fixed characteristic capacitance curve as a function of the applied voltage while having a large facility for varying the capacitance. In order to attain high Q-factors, the diode must have a very low series resistance. This series resistance essentially comprises the resistance of the epitaxial layer contained in the semiconductor arrangement and the spreading resistance. This spreading resistance is determined substantially by the skin effect.

SUMMARY OF THE INVENTION

It is an object of the invention to further reduce the series resistance in varactor or mixer diodes in order to increase the Q-factor of the components, the discharge resistance in particular is to be reduced to a negligible minimum amount. The improved diode should be capable of manufacture using conventional processes.

According to a first aspect of the invention, there is provided a varactor or mixer diode comprising a mesa shaped semiconductor element, a p-n Junction or rectifying metal semiconductor junction on the upper face of said semiconductor element and an ohmic substrate contact on the face of said semiconductor body opposite to said junction extending over the sides of said semiconductor body and ending at a small spacing from said junction.

According to a second aspect of the invention, there is provided a varactor or mixer diode comprising a semiconductor element which has a mesa shape and has a pn-junction forming a rectifying layer or a rectifying metal semiconductor junction (Schottky contact) on the upper face of the mesa elevation and an ohmic substrate contact on the other face of the semiconductor element opposite the rectifying layer, in which said substrate contact extends over the side faces of said semiconductor element as far as the upper face, which is provided with said rectifying layer or junction, on the mesa elevation and ends at a small spacing from said rectifying layer or junction.

BRIEF DESCRIPTION OF THE DRAWINGS

The invention will now be described in greater detail, by way of example, with reference to the drawings, in which.

DESCRIPTION OF THE PREFERRED EMBODIMENT

Basically the invention proposed is a varactor or mixer diode, such as that of the type described at the outset, in which the substrate contact extends over the side faces of the semiconductor element and onto the upper face of the mesa elevation, which is provided with the rectifying layer, and the substrate contact ends at a small spacing from the said rectifying layer.

The semiconductor element is preferably of mesa shape in its entirety and therefore is provided with angled side faces over which the substrate contact extends from the rear face of the semiconductor body to the front face thereof. The ohmic substrate contact is preferably covered by a passivating layer of glass on the angled side faces of the semiconductor element and on the upper face provided with the rectifying layer.

The surface metallization covering the semiconductor substrate extends close to the rectifying layer which may be formed, for example, by means of a Schottky contact so that an extremely low series resistance is achieved. The glass passivating layer, which is usually several μm in thickness, separates the two diode connecting contacts from each other so as to prevent breakdown. This glass passivating layer furthermore makes it possible for the varactor diode to be incorporated or fused into a glass casing in a manner which was not conventional prior to these components. The result of this is a particularly low-cost construction technique for producing the varactor diodes.

In the case of the rectifying layer which lies on the upper surface of the semiconductor substrate or close to the upper surfaces of the semiconductor substrate, this may be a pn-junction or a rectifying metal semiconductor junction. The diode contact bordering this barrier layer is preferably housed in an opening in the glass passivating layer. This contact may be mushroom-like in formation, for example, and may extend over parts of the passivating layer.

Figure 1:
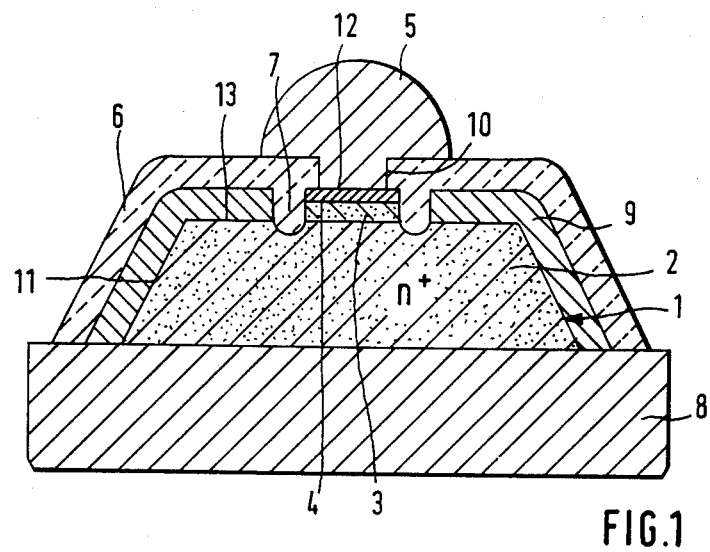
FIG. 1 is a cross-sectional view of a finished varactor diode in accordance with the invention.

Referring now to the drawings, FIG. 1 shows a mesa-shaped semiconductor element 1 which comprises n+-conductive silicon or n+-conductive gallium arsenide, for example. The semiconductor element is mesa-shaped and therefore has side faces 11 which are angled in relation to the base. These angled side faces 11, which give the semiconductor element the shape of a truncated pyramid, can also be seen from the perspective view of FIG. 2. The semiconductor element 1 has a thickness of 30 to 70 μm for example. A relatively small residual region 3 of a weakly doped layer produced by epitaxy is located on one upper face 13 of the semiconductor element. In the case of an n+-conductive base element, this epitaxial layer 3 is weakly n-conductive and approximately 0.2 to 2 μm thick. In the embodiment shown in FIG. 1, the epitaxial layer 3 only covers a small part of an upper face 13 of the semiconductor substrate 2 and is surrounded on the upper face 13 of the semiconductor substrate 2 by an annular channel 7. The epitaxial layer 3 is covered by a metal contact 4 which forms a rectifying Schottky contact with the epitaxial layer 3.

The rear face contact 8 on the semiconductor substrate 2 comprises gold or silver, for example, and has an extended portion 9 which extends over the side faces 11 of the semiconductor element and onto the opposite upper face 13 and ends close to the rectifying layer, or directly at the channel 7 in the embodiment shown. This broadened or extended portion 9 of the contact comprises gold/germanium for example and is approximately 2 to 5 μm thick.

The Schottky contact 4 comprises the layer sequence tungsten/platinum/tungsten, or the layer sequence titanium/tungsten, or molybdenum, for example, in the case where n-conductive gallium arsenide is used. A contact 4 comprising the layer sequence indium/germanium/silver is suitable for n-conductive silicon.

The side faces 11 of the mesa-shaped semiconductor element and the upper face 13 provided with the rectifying layer are finally covered by a 1 to 5 μm thick glass passivating layer 6 into which an opening 10 is formed over the Schottky contact 4 with the aid of known masking and etching techniques. The connecting contact 5 is housed in this opening and provides the electrical connection with the Schottky contact 4 at its upper surface 12. This connecting contact 5 comprises gold or silver, for example, and preferably has a mushroom-like shape so that it extends over parts of the glass passivating layer 6 outside the opening 10.

Figure 2:
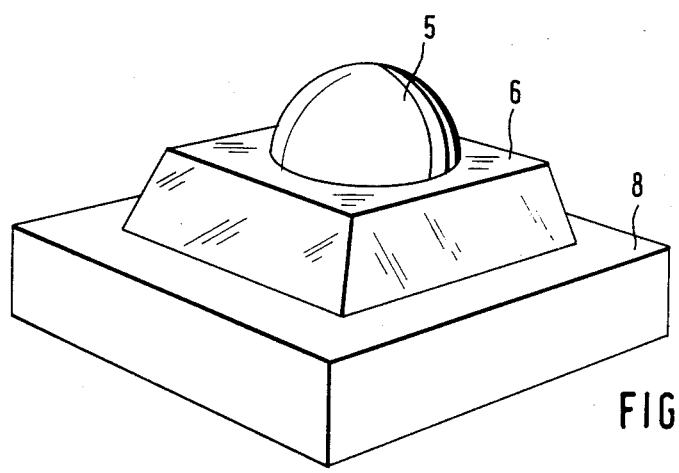
FIG. 2 shows a perspective external view of the component of FIG. 1.
Figure 3:
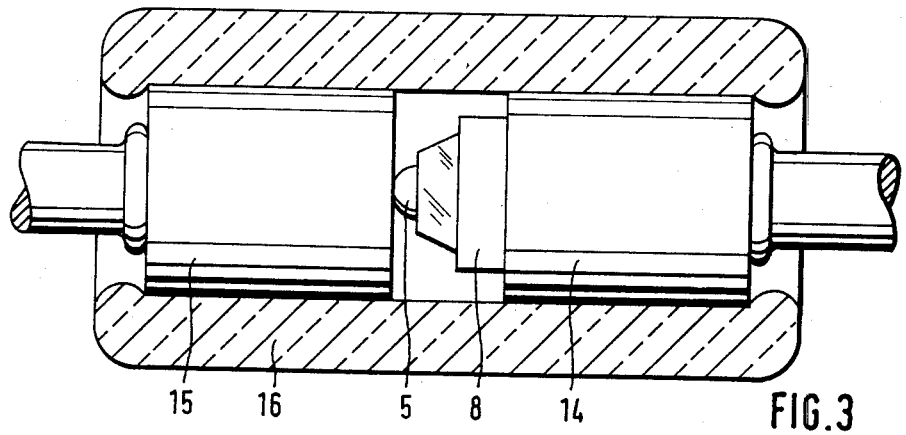
FIG. 3 shows a varactor diode fused into a glass housing.

The varactor or mixer diode shown in FIGS. 1 and 2 is incorporated preferably into a glass casing in accordance with FIG. 3. This casing comprises two metal pressure bodies 14 and 15, the varactor diode being so arranged between them that the rear face contact 8 is in direct electrical contact with the pressure body 14 and connecting contact 5 is in direct electrical contact with pressure body 15. The overall arrangement comprising the connecting electrodes 14 and 15 and the semiconductor component is finally fused into a capillary quartz glass tube 16, the fusion temperature being approximately 600° to 650° C. The possibility of fusing a varactor or mixer diode into such a capillary quartz glass casing known for other diode techniques is stated for the first time by the invention.

Figure 4:
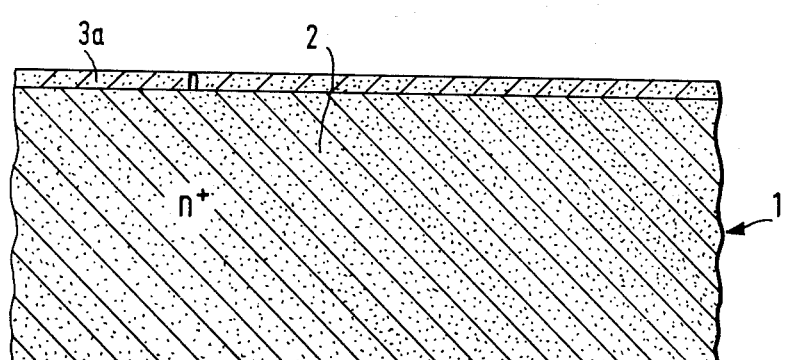
FIG. 4 shows a first production stage during the manufacture of a varactor diode in accordance with the invention.

In FIG. 4, the initial semiconductor element 1 is shown and comprises an n+-doped substrate element 2 comprising gallium arsenide or gallium/aluminum arsenide and has a doping of $5 \times 10^{18}$ to $10^{19}$ atoms/cm$^3$, for example. An epitaxial layer 3a is subsequently deposited on to this substrate element 2, for example from the gaseous phase. The layer thickness is 0.2 to 2 μm; the doping of the n-conductive layer 3a is $10^{15}$ to $10^{16}$ atoms/cm$^3$. The doping profile of the n-conductive layer 3a is set during deposition of this layer 3a in a pre-programmed manner such that the desired C(U)-characteristic curve is set.

Figure 5:
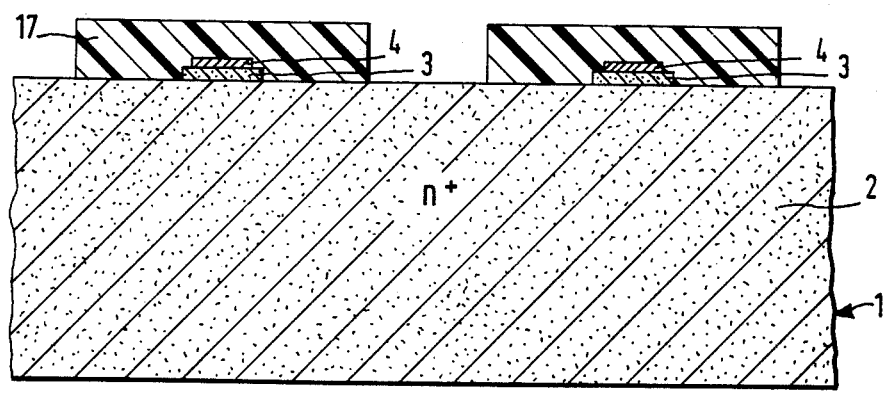
FIG. 5 shows a second production stage.

In accordance with FIG. 5, the epitaxial layer 3a of FIG. 4 is subdivided into individual regions 3, which are each associated with a diode component. This subdivision may take place before or after vapour deposition of the metal layer 4 forming the Schottky contact. If at first the Schottky contact is vapour deposited and then subdivided into individual regions with the aid of the photoresist and etching technique, these Schottky contact regions may be used as the etching mask for the purpose of subdividing the epitaxial layer. There is also the possibility of using a special photoresist and etching process for etching the epitaxial layer.

Figure 6:
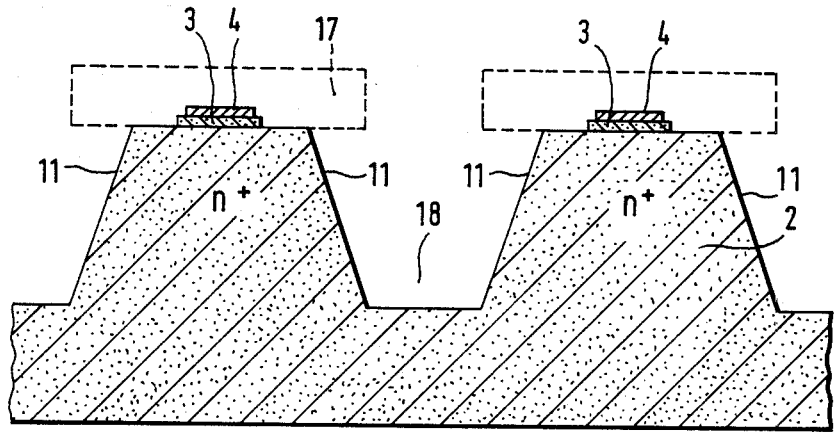
FIG. 6 shows a third production stage.

The Schottky contacts 4 which are applied to the previously cleaned regions 3 of the epitaxial layer comprise the layer sequence tungsten/platinum/tungsten, or the layer sequence titanium/tungsten or Molybdenum, for example, in the case where n-conductive gallium arsenide is the semiconductor material. Once the Schottky contacts and the epitaxial layer have been structured, the semiconductor regions associated with the individual diodes are covered by a mask, for example, a photoresist mask 17 in accordance with FIG. 5. The exposed regions of the semiconductor element 2 are removed in accordance with FIG. 6 by a chemical etching solution such that the resultant side faces of the exposed regions have an inclined angle of less than 90° so that individual mesa elevations are formed having angled faces 11. The depression 18 formed by etching, and in which the side faces 11 are formed, is approximately 50 to 100 μm deep. The following etching solutions are considered for gallium arsenide, by way of example:

$NaOH + H_2O_2 + H_2O$      1.

$NH_4OH + H_2O_2 + H_2O$      2.

$H_3PO_4 + HF + H_2O$      3.

Figure 7:
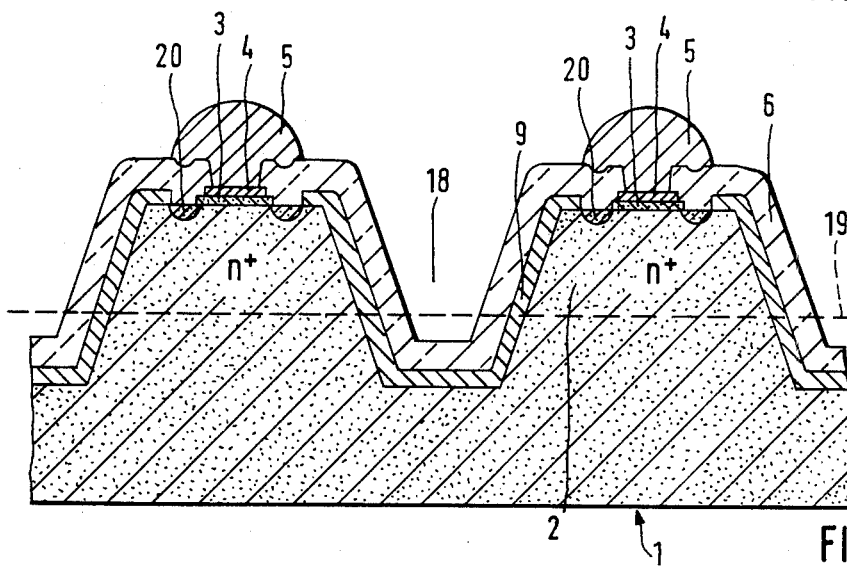
FIG. 7 shows a fourth production stage.

After this etching step, the resist masks 17 are removed again and the side faces 11 of the depression 18 produced by etching may now be coated in accordance with FIG. 7 with a metal layer 9 which comprises a gold/germanium alloy, for example. The gold/germanium layer is 0.5 μm thick, for example, and is produced by vapour deposition; if necessary, it may be thickened electrolytically with gold, while an intermediate layer of nickel may be arranged between the gold/germanium layer and the gold thickening layer produced electrolytically.

The active part of the semiconductor component is protected preferably by a channel formed in the upper face of the semiconductor element 2 or by a guard ring. A channel 7 encircling the rectifying layer is shown in FIG. 1. The refinement of a guard ring is apparent from FIG. 7. This guard ring 20 is inset into the surface of the semiconductor substrate element 2 so that it encircles the epitaxial layer 3 and therefore the Schottky contact 4, which is arranged on the epitaxial layer, annularly. This annular semiconductor region 20 is produced preferably by means of implantation of oxygen or chromium ions and has a very small n−-doping. The width of the ring is between 1 and 4 μm according to the technical considerations in each case. During manufacture of the annular region, the metal layers 9 and 4 can be used as the implantation mask. Because of this, the upper face region of the semiconductor element, which lies between the Schottky contact 4 and the metal layer 9, is filled by the guard ring 20.

Finally, the surface of the semiconductor is covered by the glass passivating layer 6 which is 1 to 5 μm thick for example. An opening is formed in the glass layer 6 over the Schottky contacts 4, a mushroom-like connecting contact 5 being arranged in this opening to the Schottky contact 4. These mushroom-like connecting electrodes 5 which, for example, comprise gold or silver and are produced preferably by electrolytic deposition are 100 μm thick, for example, and extend over the glass passivating layer 6.

The semiconductor arrangement shown in FIG. 7 is now fixed to a holder by means of the upper faces provided with the connecting electrodes 5, and is thinned on the opposite side, until individual semiconductor diodes are formed. This is the case if the semiconductor material is removed as far as the line 19 shown in broken lines so that the channels 18 are cut by mechanical thinning or etching away the rear faces.

The rear face of the semiconductor elements is covered subsequently by an ohmic connecting electrode 8 in accordance with FIG. 1 made of gold or silver. These rear face or substrate electrodes 8 may be manufactured by initially vapour depositing a thin layer of metal on to the semiconductor body 2 and finally be reinforcing them electrolytically. When producing the rear face contact 8 (FIG. 1.), connection is also made between the metal layers 9 on the side faces 11 of the mesa elevations, and the substrate connecting contact 8. Once the semiconductor components have been separated out individually by removing them from the carrier plate they are fused preferably into the quartz glass casing as has already been described and shown in FIG. 3. It has been proved that the varactor or mixer diodes in accordance with the invention have a series resistance which is less than 0.1.

It will be understood that the above description of the present invention if susceptible to various modification changes and adaptations.

What is claimed is:

1. A varactor or mixer diode comprising: a semiconductor element which has a mesa shape with inclined side faces; a rectifying pn-junction or a rectifying metal semiconductor junction (Schottky contact) on the upper face of said mesa shaped semiconductor element; a metal plate forming an ohmic substrate contact disposed on the lower face of said mesa shaped semiconductor element, said substrate contact having a metal portion which completely extends over said side faces of said semiconductor element onto said upper face which is provided with said rectifying junction, and which ends at a small spacing from said junction; and an electrical isolation means disposed in said upper face for separating said junction from said metal portion.

2. A varactor or mixer diode as defined in claim 1 further comprising a glass passivating layer covering said portion of said substrate contact on said side faces and on said upper face of said semiconductor element.

3. A varactor or mixer diode as defined in claim 2, wherein said glass passivating layer covers the entire said upper face except for an opening for receiving an electrical contact for the diode, and further comprising an electrical contact for said diode extending through said opening.

4. A varactor or mixer diode as defined in claim 3, wherein said electrical contact extends, in the shape of a mushroom, out of said opening in said passivating layer and then laterally over said passivating layer.

5. A varactor or mixer diode as defined in claim 3, wherein said electrical contact comprises silver.

6. A varactor or mixer diode as defined in claim 3, wherein said electrical contact comprises gold.

7. A varactor or mixer diode as defined in claim 3, and comprising a metal contact arranged on said upper face of said semiconductor element, forming a Schottky contact with a relatively weakly doped surface layer or forming an ohmic contact with a relatively highly doped surface layer, and in connection with said electrical contact.

8. A varactor or mixer diode as defined in claim 7, wherein said metal contact forms a Schottky contact and comprises the layer sequence indium/germanium/silver, starting from the diode, when the semiconductor material used is n-conductive silicon.

9. A varactor or mixer diode as defined in claim 7, wherein said metal contact forms a Schottky contact and comprises the layer sequence tungsten/platinum/tungsten, starting from the diode, or the layer sequence titanium/tungsten when the semiconductor material used is n-conductive gallium arsenide.

10. A varactor or mixer diode as defined in claim 1, wherein said substrate contact comprises gold or silver on said lower face of said semiconductor element and comprises gold/germanium on said side faces of said semiconductor element.

11. A varactor or mixer diode as defined in claim 1 wherein said electrical isolation means comprises a guard ring formed in said upper face and encircling said junction; and wherein said portion of said substrate contact ends at said guard ring.

12. A varactor or mixer diode comprising: a mesa shaped semiconductor element, a pn-junction barrier layer or rectifying metal semiconductor junction on the upper face of said semiconductor element, an ohmic substrate contact having a first portion in the form of a metal plate disposed on a face of said semiconductor body opposite to said upper face and having a further metal portion extending completely over the sides of said semiconductor body and onto said upper face, and ending on said upper face at a small spacing from said barrier layer or junction, and electrical isolation means, disposed in said upper face and surrounding said junction, for separating said junction from said metal portion.

13. A varactor or mixer diode as defined in claim 11 wherein said rectifying junction is a rectifying metal semiconductor junction formed between a metal contact and a semiconductor epitaxial surface layer of one conductivity type formed on a limited portion of said upper face; said semiconductor element is of said one conductivity type and has a higher doping concentration than said surface layer; and said guard ring is of said one conductivity type and has a lower doping concentration than said surface layer.

14. A varactor or mixer diode as defined in claim 13 wherein said semiconductor element has a doping concentration of approximately $5 \times 10^{18}$ to $10^{19}$ atoms/cm$^3$ and said surface layer has a doping concentration of approximately $10^{15}$ to $10^{16}$ atoms/cm$^3$.

15. A varactor or mixer diode as defined in claim 2 wherein said electrical isolation means comprises a channel formed in said upper face and encircling said junction, and wherein said portion of said substrate contact ends at said channel, and said channel is filled with said glass passivating layer.

* * * * *